United States Patent
Pak et al.

(10) Patent No.: US 10,679,712 B2
(45) Date of Patent: Jun. 9, 2020

(54) NON-VOLATILE MEMORY DEVICE AND METHOD OF BLANK CHECK

(71) Applicant: Cypress Semiconductor Corporation, San Jose, CA (US)

(72) Inventors: James Pak, Sunnyvale, CA (US); Shivananda Shetty, San Jose, CA (US); Yoram Betser, Mazkeret Batya (IL); Amichai Givant, Rosh Ha'Ayin (IL); Jonas Neo, San Jose, CA (US); Pawan Singh, Santa Clara, CA (US); Stefano Amato, San Jose, CA (US); Cindy Sun, Fremont, CA (US); Amir Rochman, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 7 days.

(21) Appl. No.: 16/208,841

(22) Filed: Dec. 4, 2018

(65) Prior Publication Data
US 2019/0198125 A1 Jun. 27, 2019

Related U.S. Application Data

(60) Provisional application No. 62/608,718, filed on Dec. 21, 2017.

(51) Int. Cl.
*G11C 16/04* (2006.01)
*G11C 16/34* (2006.01)
(Continued)

(52) U.S. Cl.
CPC .......... *G11C 16/3445* (2013.01); *G11C 16/28* (2013.01); *G11C 11/5621* (2013.01);
(Continued)

(58) Field of Classification Search
CPC . G11C 16/3445; G11C 16/28; G11C 16/5621; G11C 16/5671
(Continued)

(56) References Cited

U.S. PATENT DOCUMENTS 7,646,642 B2    1/2010   Fujito et al.
7,719,900 B2    5/2010   Okayama et al.
(Continued)

FOREIGN PATENT DOCUMENTS

| CN | 103077747 A | 5/2013 |
| CN | 101751995 B | 10/2014 |
| EP | 1366497 B1 | 6/2014 |

OTHER PUBLICATIONS

International Search Report for International Application No. PCT/US18/66057 dated Feb. 28, 2019; 3 pages.
(Continued)

*Primary Examiner* — Vu A Le

(57) ABSTRACT

A non-volatile memory device and methods for operating the same are provided. The memory device may have multiple complementary memory cells. The method of blank check includes detecting a state value of each of the true and complementary transistors, generating an upper state value, Wherein a first predetermined amount of the true and complementary transistors have greater state values than the upper state value, generating a lower state value, wherein a second predetermined amount of the true and complementary transistors have less state values than the lower state value, generating a state value range based on a difference between the upper state value and the lower state value, and comparing the state value range to a threshold value to determine whether the plurality of complementary memory cells is in a blank state or a non-blank state. Other embodiments are also disclosed herein.

21 Claims, 10 Drawing Sheets

(51) Int. Cl.
*G11C 16/28* (2006.01)
*G11C 11/56* (2006.01)

(52) U.S. Cl.
CPC ...... *G11C 11/5671* (2013.01); *G11C 16/0425* (2013.01); *G11C 16/0466* (2013.01)

(58) Field of Classification Search
USPC .................................................. 365/185.21
See application file for complete search history.

(56) References Cited

U.S. PATENT DOCUMENTS

| | | |
|---|---|---|
| 8,416,624 B2 | 4/2013 | Lei et al. |
| 8,477,535 B2 | 7/2013 | Kato |
| 9,070,475 B2 | 6/2015 | Sharon et al. |
| 9,164,836 B2 | 10/2015 | Guo et al. |
| 9,196,320 B2 | 11/2015 | Kern et al. |
| 9,224,457 B2 | 12/2015 | Hemink et al. |
| 9,640,230 B2 | 5/2017 | Carissimi et al. |
| 9,773,529 B1 | 9/2017 | Danon et al. |
| 9,805,771 B2 | 10/2017 | Loibl et al. |
| 2009/0073762 A1* | 3/2009 | Lee ............ G06F 11/1072 365/185.03 |
| 2009/0254696 A1* | 10/2009 | Kasai ............ G11C 16/344 711/103 |
| 2013/0343125 A1 | 12/2013 | Gillingham et al. |
| 2016/0180948 A1* | 6/2016 | Tanabe ............ G11C 16/0475 365/185.21 |

OTHER PUBLICATIONS

Written Opinion of the International Searching Authority for International Application No. PCT/US18/66057 dated Feb. 28, 2019; 6 pages.

Micheloni, R., "Multi-bit NAND Flash Memories for Ultra High Density Storage Devices," Advances in Non-Volatile Memory and Storage Technology, 2014, pp. 75-119; 45 pages.

\* cited by examiner

NON-VOLATILE MEMORY DEVICE AND METHOD OF BLANK CHECK

PRIORITY

The present application claims the priority and benefit under 35 U.S.C. § 119(e) of U.S. Provisional Application No. 62/608,718, filed on Dec. 21, 2017, which is incorporated by reference herein in its entirety.

TECHNICAL FIELD

The present disclosure relates generally to a non-volatile memory (NVM) device, and more particularly, to methods and embodiments of performing memory blank check during read and write operations.

BACKGROUND

Memory that retains its data even when operation power is not available is classified as non-volatile memory (NVM). Examples of non-volatile memory are nvSRAM, ferroelectric RAM (F-RAM), programmable-read-only memory (PROM), erasable-programmable-read-only memory (EPROM), electrically-erasable-programmable-read-only-memory (EEPROM), and flash memories. Some memory arrays may include multiple memory cells that utilize transistors and gate structures. Such memory cells may include a charge trapping layer, such as a nitride layer or an oxynitride layer. The charge trapping layer may be programmed to store data based on voltages applied to or received by the memory array. This class of memory may be used in applications in which critical data must be stored after power is removed, or when power is interrupted during operation.

The memory cells may be programmable to one of the two binary states, programmed or erased. In some embodiments, a programmed cell may be assigned a bit value "0" and an erased cell a bit value "1". In other embodiments, the assignment may be reversed. In single-ended sensing configuration, each memory cell stores one bit of data. A binary state value of the cells, such as threshold voltage (Vt) or cell current (I), may be compared to a reference value to determine the binary state (programmed or erased) of the cell. In differential sensing configuration, two memory cells (true or target and compier twin cells) may form a complementary pair to store one bit of data. The bit value of the complementary pair corresponds to the state of the target cell. The binary state value of the target cell may be compared to the twin cell to determine the binary state of the complementary pair.

Memory cells may also be multi-level storage cells in which each memory cell may store more than one bits of data.

BRIEF DESCRIPTION OF THE DRAWINGS

The present disclosure is illustrated by way of example, and not by way of limitation, in the FIGS. of the accompanying drawings.

DETAILED DESCRIPTION

Figure 1:
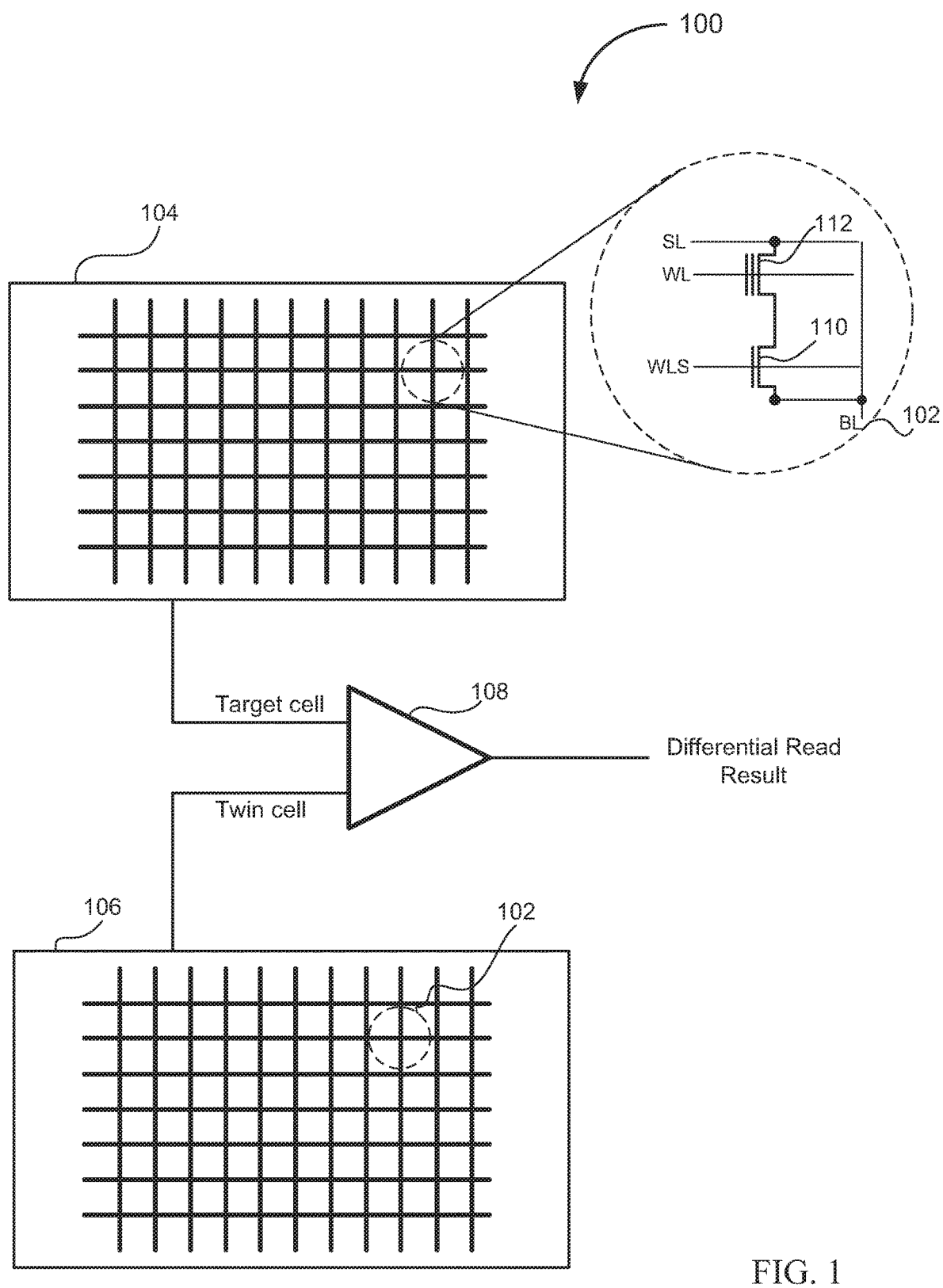
FIG. 1 is a schematic diagram illustrating an NVM device in accordance with one embodiment of the subject matter.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Unless specifically stated otherwise, as apparent from the following discussions, it is appreciated that throughout the specification discussions utilizing terms such as "detecting", "processing", "computing", "calculating", "determining", or the like, refer to the action and/or operations of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

SUMMARY OF SUBJECT MATTER

According to one embodiment, a method for operating a memory device of the subject matter may include detecting a state value of each of the true and complementary transistors, generating n upper state value, wherein a first predetermined amount of the true and complementary transistors have greater state values than the upper state value, generating a lower state value, wherein a second predetermined amount of the true and complementary transistors have less state values than the lower state value, generating a state value range based on a difference between the upper state value and the lower state value, and comparing the state value range to a threshold value to determine whether the plurality of complementary memory cells is in a blank state or a non-blank state. In one embodiment, the memory device may include a plurality of complementary memory cells, and each may include a true transistor and a complementary transistor.

According to one embodiment, the state values of the true and complementary transistors of a same complementary memory cell may be used to determine a binary state of the cell, and the binary state may represent a programmed state or an erased state.

According to one embodiment, the state value may be a threshold voltage of the true and complementary transistors of the plurality of complementary memory cells, and the threshold value may be a voltage value measured in volts.

According to another embodiment, the state value may be a cell current of the true and complementary transistors of the plurality of complementary memory cells, and the threshold value may be a current value measured in amperes. In one embodiment, the cell current may be generated by applying a predetermined voltage to the gates of the true and complementary transistors. In other embodiments, the cell current may be generated by other methods known in the art. In one embodiment, the method for operating a memory device of the subject matter may also include comparing the lower state value to a cell current parameter. In one embodiment, when the lower state value is less than the cell current parameter, the plurality of complementary memory cells may be determined to be in the non-blank state.

According to one embodiment, the method for operating the memory device of the subject matter may also include ranking the state values of at least two of the true and complementary transistors of the plurality of complementary memory cells.

According to one embodiment, at least one of the first predetermined amount and the second predetermined amount may represent a percentage (%).

According to another embodiment, at least one of the first predetermined amount and the second predetermined amount may represent a natural number.

In some embodiments, the threshold value may be programmable and updated based on at least one of the following parameters: charge loss, length of life, array cycle count, and a state of beginning of life or end of life of the plurality of complementary memory cells.

According to one embodiment, generating the upper state value and the lower state value may include performing binary searches on the state values of the true and complementary transistors.

According to one embodiment, when the state value range is greater than the threshold value, the plurality of complementary memory cells may be determined to be in the non-blank state, and when the state value range is less than the threshold value, the plurality of complementary memory cells may be determined to be in the blank state.

In one embodiment, the blank state may indicate all of the true and complementary transistors of the plurality of complementary memory cells may be intended to be written in an erased state. The non-blank state may indicate one half of the true and complementary transistors of the plurality of complementary memory cells may be intended to be written in the erased state, while another half of the true and complementary transistors of the plurality of complementary memory cells in the programmed state.

According to one embodiment, a memory device of the subject matter may include a plurality of complementary memory cells, each including a true transistor and a complementary transistor and a processing element may be coupled to the plurality of complementary memory cells. The processing element may be configured to detect a cell current of each of the true and complementary transistors by applying a predetermined gate voltage thereon, generate an upper cell current value, wherein a first predetermined amount of the true and complementary transistors have greater cell currents than the upper cell current value, generate a lower cell current value, wherein a second predetermined amount of the true and complementary transistors have less cell currents than the lower cell current value, generate a cell current range based on the upper and lower cell current values, generate a first binary state indicator based on a comparison of the cell current range and a threshold value. In one embodiment, the memory device may also include a plurality of sensing devices configured to determine a binary state of each of the plurality of complementary memory cells.

In one embodiment, the plurality of sensing devices may include sense amplifiers configured to generate a differential sensing result of the true and complementary transistors of a same complementary memory cell.

According to one embodiment, the memory device may also include a plurality of multiplexors, wherein each multiplexor may be configured to be coupled to the differential sensing result of one of the plurality of complementary memory cells and an erased binary state signal, each multiplexor may be further configured to be coupled to the first binary state indicator as a first control signal.

According to one embodiment, the processing device may be further configured to generate a second binary state indicator based on a comparison of the lower cell current value to a cell current parameter, and wherein the second binary state indicator lay be coupled to each of the multiplexors as a second control signal.

According to one embodiment, a binary state of the plurality of complementary memory cells represents a blank state or a non-blank state of the cell.

According to one embodiment, a non-transitory computer readable storage medium comprising stored instructions thereon, the instructions when executed cause a processing element to execute a blank check of N x complementary memory cells, each complementary memory cell includes a true cell and a complementary cell. In one embodiment, the blank check may include detecting a state value of each of the true and complementary cells, generating an upper state value, wherein a first predetermined amount of the true and complementary cells have greater state values than the upper state value, generating a lower state value, wherein a second predetermined amount of the true and complementary cells have less state values than the upper state value, generating a state value range based on the upper state value and the lower state value, and generating a first blank state indicator based on a comparison between the state value range to a threshold value, wherein the first blank state indicator verifies the N x complementary memory cells is in a blank state when the state value range is less than the threshold value, and the N x complementary memory cells is in a non-blank state when the state value range is greater than the threshold value.

According to one embodiment, the state, value may be a cell current, and wherein the blank check may further include generating a second blank state indicator based on a comparison between the lower state value and a cell current parameter, wherein the second blank state indicator verifies the N x complementary memory cells is in the non-blank state when the lower state value is less than the cell current parameter.

According to one embodiment, the processing element may be configured to execute a read command of the N x complementary memory cells based on the first blank state indicator when the N x complementary memory cells are determined to be in the non-blank state.

According to another embodiment, the processing element may be configured to proceed to execute a read command of the N x complementary memory cells based on at least one of the first and second blank state indicators.

Computers and other processing devices may store information or programs which have been developed or updated in NVM, such as flash memory including NAND and NOR, EEPROM, F-RAM. In the event of a power down, power outage or a mistake, data may be retrieved. To get access to the stored bits of information, memory cells of the NVM may be read using single-ended sensing wherein a value associated with the binary state of the memory cell (such as threshold voltage, cell current, etc.) may be detected and compared to a reference value, or memory cells may be read using differential sensing which will be discussed in more detail.

FIG. 1 is a schematic diagram illustrating a portion of NVM device 100 configured for differential sensing during read operations. Differential sensing may be useful in various embodiments and practical applications that require longer data retention. Also, it does not require a reference value (voltage value or current value or others) to determine the binary state of each memory cell and may have wider sensing margin compared to single-ended sensing. In one embodiment, NVM device 100 may include true or target cell array 104 and complementary or twin cell array 106. Memory cells 102 may be arranged in rows and columns in each array, connected to one another according to system/circuit design requirements in various ways that are practiced in the art. Memory cells 102 in target cell array 104 and twin cell array 106, according to some embodiments, may be accessed through multiple word lines (WLs), bit lines (BLs), select lines (WLSs), source lines (SLs), etc. For each operation mode, such as read, erase, and program, one or multiple WLs, BLs, SLs, or WLSs may be asserted accordingly. Various voltage or current signals may be applied to one or more WLs, BLs, SLs, or WLSs depending on the operation mode and addresses of the memory cell(s) 102 selected for the operations. In some embodiments, target and twin cell arrays 104 and 106 may be divided physically into multiple sectors, in which each sector may include fixed or variable number of rows and columns of memory cells 102.

Referring to FIG. 1, memory cells 102 may be a two-transistor (2T) memory cell, in Which one transistor may be a memory transistor 112 having a memory gate (MG), while another transistor may be a pass transistor or select transistor 110 having a select gate (SG). 2T memory cell may also include source or source region, drain or drain region. The pass transistor 110 may be a field-effect transistor (FET), such as a metal-oxide-semiconductor field-effect transistor (MOSFET), used as a switch to control voltage levels and or current levels at nodes of the memory cell 102 (e.g., at the source and or drain of pass transistor and or memory transistor). The memory transistor 112 may be a transistor that stores one or more bit of binary information, for example by varying the charge stored in charge trapping layer f the memory transistor 112. In one embodiment, a single WL, WES, and SL may connect memory cells 102 of the same row, while one single BL may connect memory cells 102 of the same column. In other embodiments, connections may be different according to system requirements and circuit design.

In some implementations, memory cell 102 may include different number of transistors, such as a single memory transistor (1T), a three transistor memory cell, or otherwise. In other embodiments, memory cell 102 may be split gate memory cell that includes memory gate (MG) disposed adjacent to select gate (SG), in which MG and SG may have a common channel, a source or source region, and a drain or drain region. There may be a dielectric layer separating the MG and SG. Split gate memory cell may also be addressed as a 1.5 transistor (1.5T) memory cell. In various embodiments, memory arrays 104 and 106 may contain 2T memory cells, split gate memory cells, 1T memory cells, a combination thereof, or other types of NVM cells. It will be the understanding that memory array configuration details and operation details discussed in later sections are applicable to at least the 2T memory cell array, split gate memory cell array, and arrays having other combinations of memory cells. It should also be the understanding that the terms "rows" and "columns" of a memory array are used for purposes of illustration, rather than limitation. In one embodiment, rows are arranged horizontally and columns are arranged vertically. In another embodiment, the terms of rows and columns of memory array may be reversed or used in an opposite sense, or arranged in any orientation.

In one embodiment, one memory cell 102 from target cell array is paired up with one memory cell 102 from twin cell array 106 to form a complementary pair to store one bit of data, or a two cells per bit configuration. In one embodiment, memory cells 102 in target and twin arrays 104 and 106 may have approximately same structural features. Memory cells of the same complementary pair are programmed to opposite binary states ("1" and "0"). Memory cells in target cell ay represent the true bit and twin cell array the complementary bit. In one embodiment, during reading of a particular complementary pair, the target cell and twin cell are coupled to two separate inputs of a sense amplifier 108 in which binary state values, such as threshold voltage, cell current of the two memory cells in the compier y pair are compared against one another. In one embodiment, state values of the target and twin cells may not be compared directly. Depending on the comparison result, the binary state of the complementary pair will be determined as differential read result and output. It should be the understanding that FIG. 1 illustrates one exemplary embodiment wherein memory cells in the same complementary pair are physically located in two separate arrays for illustrative purposes only. In other embodiments, complementary cells may be physically located in the same array, or the same sector depending on system requirements and circuit design.

In one embodiment, the binary value "0" is assigned to a programmed memory cell and "1" to an erased memory cell. Therefore, in a programmed complementary pair, the target cell may represent "0" and the twin cell "1". Similarly, in an erased complementary pair, both the target cell and twin cell play represent "1". The same assignment will be adopted throughout this document for illustrative purposes, and not limitation. One having ordinary skill in the art would recognize the assignment of binary values to programmed and erased memory cells may be reversed in some embodiments.

Referring to FIG. 1, sense amplifier 108 or other types of comparator compares signals detected or outputted from the target memory cell and twin memory cell against one another, either directly or indirectly. In one embodiment, sense amplifier 108 compares threshold voltages of the two memory cells in order to determine the binary state of the complementary pair. Threshold voltage (Vt) of a cell, such as memory cell 102, corresponds to the memory gate voltage required to make memory cell 102 conduct a fixed amount of reference current. In one embodiment, when memory transistor 112 of memory cell 102 is an n-channel transistor, threshold voltage of a programmed memory cell (Vtp) may be greater than threshold voltage of an erased memory cell (Vte). In another embodiment, another binary state value such as cell currents (I) of the target and twin memory cells are compared. Cell current of a cell, such as memory cell 102, corresponds to the conducted current of a cell, such as memory cell 102, when a fixed memory gate voltage is applied to MG. In one embodiment when memory. transistor is an n-channel transistor, cell current of a programmed memory cell (Ip) may be less than cell current of an erased memory cell (Ie).

Based on the result of the comparison of binary state values, such as Vt or I, of the target and twin memory cells, sense amplifier or other sensing devices may determine the binary state of the complementary pair. A summary of the differential sensing results are presented in the following table.

TABLE 1

| Binary State of Complementary Pair | Binary State of Target Cell | Binary State of Twin Cell | Threshold Voltage (Vt) Relationship | Cell Current (I) Relationship | Differential Read Result |
|---|---|---|---|---|---|
| Programmed/ Non-Blank | Programmed or "0" | Erased or "1" | Vtp (Target Cell) > Vte (Twin Cell) | Ip (Target Cell) < Ie (Twin Cell) | Programmed or "0" |
| Programmed/ Non-Blank | Erased or "1" | Programmed or "0" | Vte (Target Cell) < Vtp (Twin Cell) | Ie (Target Cell) > Ip (Twin Cell) | Erased or "1" |
| Erased/Blank | Erased or "1" | Erased or "1" | Random | Random | Random "1" or "0") |

Referring to Table 1, when a complementary pair is programmed with a meaningful data (non-blank), target and twin cells may have opposite binary states ("0" and "1" or "1" and "0"). Since Vtp and Vte of memory cells 102 may have a reasonable difference in magnitude, the differential read result of the complementary pair is relatively definite. However, when complementary pair is blank, both target and twin cells have the same binary state (erased or "1"). In one embodiment, sense amplifier 108 compares the magnitude of Vte or Ie of target and twin cells. Although target and twin cells may have similar structural features, Vte or Ie of the two cells may not be exactly the same and the minor difference in Vte or Ie may be detected by sense amplifier 108. As a result, the differential read result will be false and random. In one embodiment, the complementary pair may be read as being programmed with a meaningful data bit when it is in fact blank. Therefore, it is imperative to verify that a complementary pair is not blank before a differential read.

Figure 2:
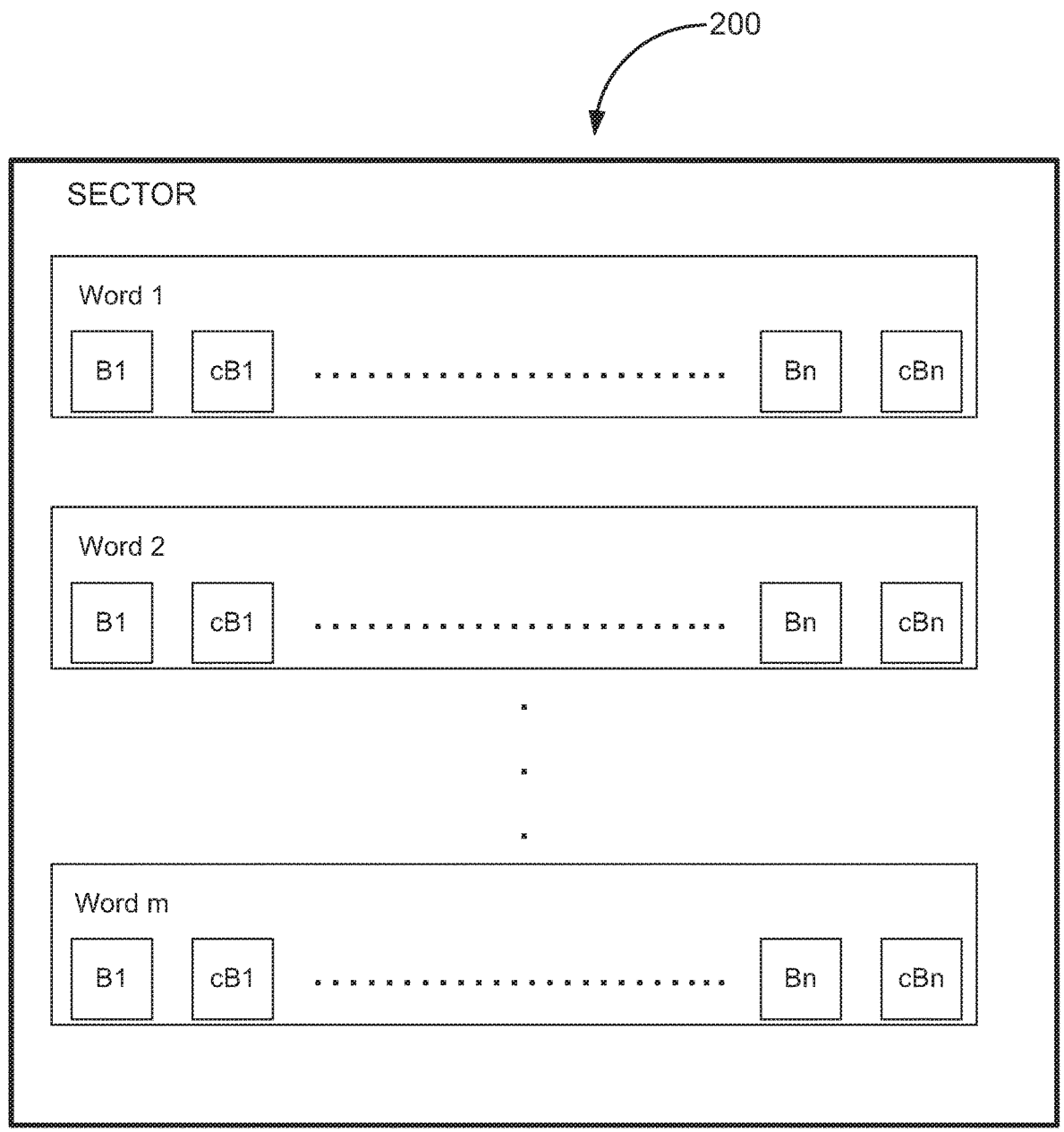
FIG. 2 is a schematic diagram illustrating a memory sector of the NVM device in accordance with one embodiment of the subject matter.

FIG. 2 is a schematic diagram illustrating sector 200 of NVM device 100. FIGS. 3A to 3D are representative histograms illustrating threshold voltage distributions of memory cells according to various embodiments of the disclosure. Referring to FIG. 2, in one embodiment, sector 200 includes m words (word 1 to m) and each word includes n x target cells representing n true bits (true bits B1-Bn) and n x twin cells representing n complementary bits (cB1-cBn), NVM device 100 may be configured for a 2-cell per bit configuration, in which each Bi and cBi form a complementary pair. In various embodiments, target cells and twin cells may or may not be disposed in the same physical sector or array.

Figure 3A:
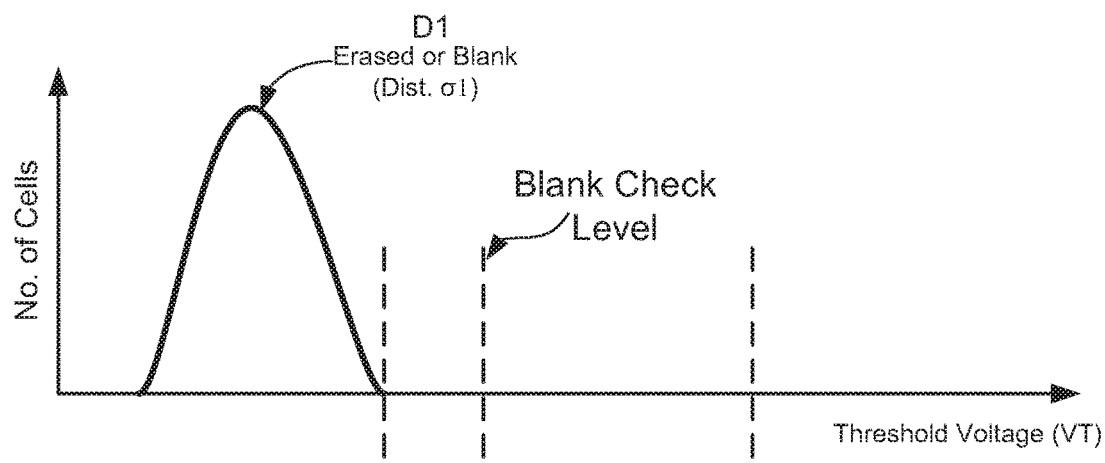
FIGS. 3A-3D are schematic diagrams illustrating distributions of threshold voltages of a portion of the NVM device in accordance with one embodiment of the subject matter.

When differential sensing is adopted in a memory device, such as NVM device 100, a check needs to be performed to verify that a word being written to is blank (all cells erased or "1"). NVM device 100 may be a flash memory device or an EEPROM device. As an example, word 1 of sector 200 may be erased as a first step of a write operation. As illustrated in FIG. 3A, all 2 x n memory cells (B1-Bn and cB1-cBn) are erased and their threshold voltages may approach each of their Vte. Due to possible structural differences and other parameters, Vte of each memory cell may vary slightly and result in distribution D1 with deviation σ1. In one embodiment, Vte of all 2n cells may be less than erase verify value (EV). A blank check level may be predetermined to be higher than EV. In one embodiment, a blank check may be performed by comparing Vt of each of the 2n memory cells to the blank check level. If Vt of none or less than a predetermined number or percentage of memory cells is above the blank check level, word 1 is determined as blank or erased (no meaningful hit). It is therefore safe to write real data bits to word 1.

Figure 3B:
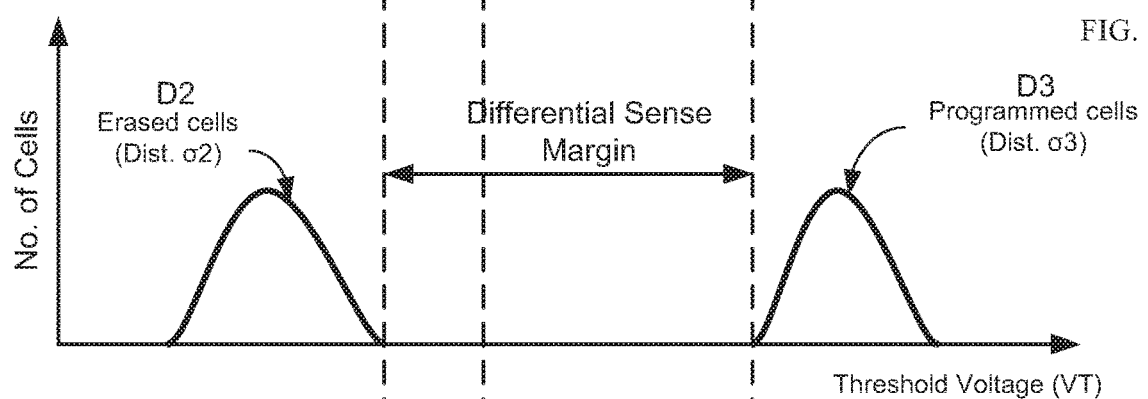
Figure 3C:
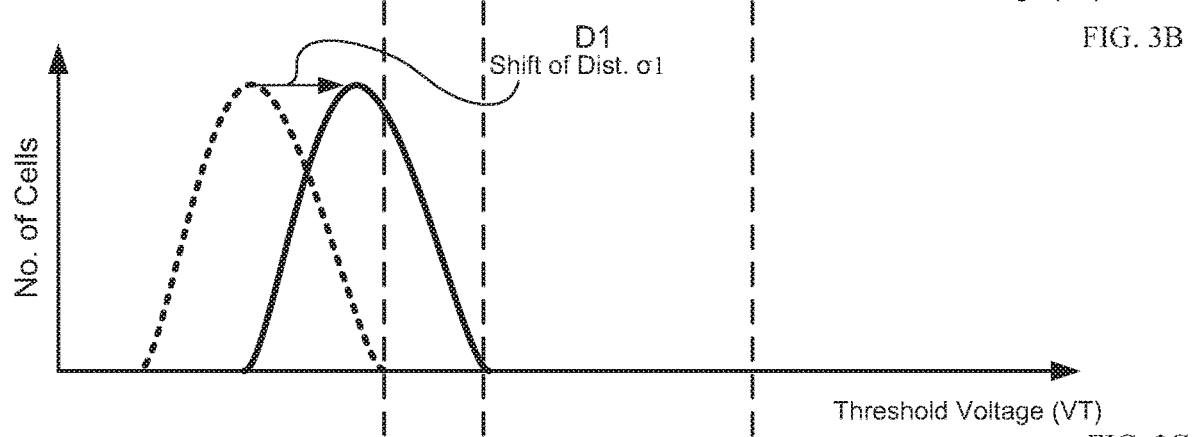

In one embodiment, reliability of using a blank check level may be reduced when Vt of the erased bits increases after a large number of Program/Erase (P/E) cycles possibly due to erase push out, charge gain, or other reasons. FIG. 3C illustrates possible upward shift of Vt of erased memory cells (Vte). As best illustrated in FIG. 3C, Vte of memory cells shifts upward and some may surpass EV or the blank check level. In one embodiment, when the aforementioned blank check is performed, it may indicate that word 1 is non-blank due to enough numbers of Vte are now above the blank check level. The false result may forbid meaningful data bits to be written to word 1, or falsely read out random bits from word 1 as meaningful data bits. In one embodiment, the blank check level may be set higher in order to counter the possible upward shift of Vte of memory cells. However, increasing the blank check level may increase the probability that Vt of programmed memory cells (Vtp) being less than the blank check level. This trade-off for the blank check level compromises the reliability of the blank check and may not guarantee the longer data retention specification other vise afforded by the differential sensing alone.

It is important that a word that is targeted to be read differentially has already been differentially programmed with meaningful or real data bits (non-blank word). FIG. 3B illustrates distribution of Vt of memory cells in a non-blank word. Using word 1 of sector 200 as an example, in which meaningful data bits were written to word 1. In one embodiment, regardless of the combination of data bits, Bi and cBi in the same complementary pair i will be "0" and "1" or "1" and "0". Cumulatively, as best illustrated in FIG. 3B, Vt of half of the memory cells (n cells) may approach Vte as distribution D2 with deviation σ2 and Vt of the other half of memory cells (n may approach Vtp as distribution D3 with deviation σ3. In one embodiment, Vt of n erased ("1") cells may be less than erase verify value (EV) and Vt of the other n programmed ("0") cells may be greater than program verify value (PV). In some embodiment, the difference between PV and EV may represent the sense margin of the differential sensing of complementary pairs. In one embodiment, the blank check level is determined as a value between EV and PV. Therefore, during a blank check procedure, Vt of half of the memory cells (n) may be less than the blank check level and half above the blank check level. In one embodiment, it may be safe to conclude that word 1 is programmed with meaningful data bits and results of the differential sensing of complementary pairs (B1-cB1-Bn-cBn) of word 1 may be valid reads.

Figure 3D:
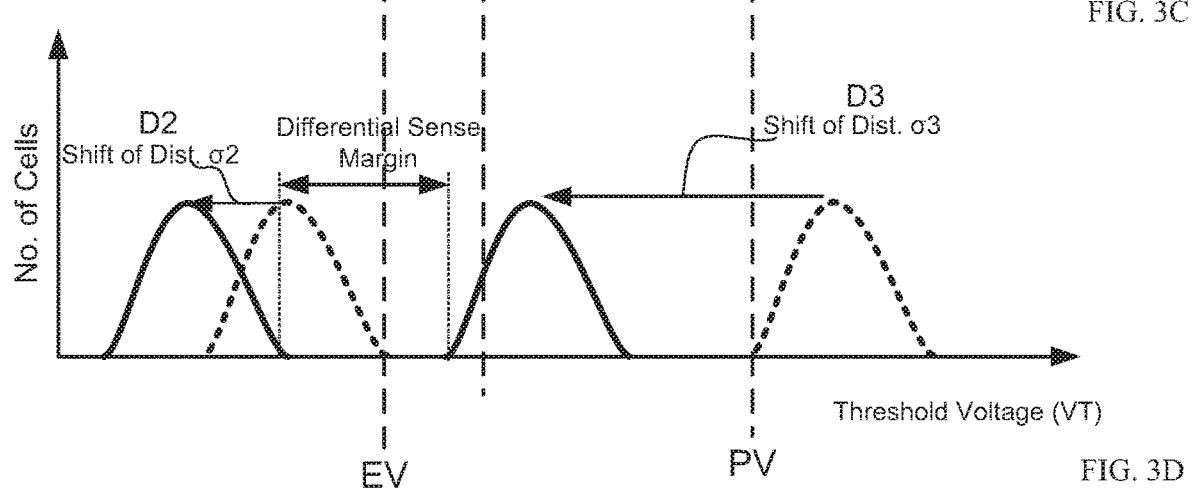

In one embodiment, memory cells in programmed words may lose charge after a relatively long retention time, especially as they approach the end of data retention specification. As a result, Vt of memory cells may shift downward. FIG. 3D illustrates Vt distribution of memory cells of a programmed word, such as word 1. As illustrated in FIG. 3D, Vt of programmed memory cells (Vtp) may shift downward due to the potential charge loss. In one embodiment, Vt of erased memory cells (Vte) may also shift downward because of similar reasons, although the shift may be in a lesser or different degree. As a results, Vtp of some memory cells may dip below the original blank check level, or even EV. The downward shifting of Vtp may increase the chance that a programmed word (non-blank) is assumed to be blank. As a result, a read operation may not be carried out even though sense margin may be adequate for a valid differential sensing, or data may be falsely written to a supposedly non-blank word. In one embodiment, the blank check level may be set lower such that most if not all Vtp of programmed memory cells are above it. However, it may compromise the reliability of blank check due to upward shifting of Vte (high P/E cycles) as previously described in FIG. 3C. In some embodiments, shifting of Vte and Vtp of memory cells may render distribution D2 and D3 overlapping in some Vt range.

In one embodiment, it may be difficult to determine an ideal blank check level to satisfy both the high P/E cycles (Vte upward shift in FIG. 3C) and long retention time (Vtp or Vte downward shift in FIG. 3D) while maintaining an optimal sense margin. Therefore, it may be beneficial to develop a blank check algorithm that does not rely on using a blank check level. In one embodiment, a blank check algorithm may be developed relying on the relatively significant separation between Vte (D2) and Vtp (D3) distributions regardless of the endurance and retention situations. Referring to FIGS. 3A and 3B, in the blank state (all memory cells are erased), Vt of all the memory cells in word 1 belong to the same erased (Vte) distribution D1. In one embodiment, distribution D1 may exhibit a narrower spread compared to the non-blank state of word 1. As shown in FIG. 3B, half the memory cells belong to the erased (Vte) distribution D2 and the other half belong to the programmed (Vtp) distribution D3. As best shown in FIGS. 3C and 3D, even with the potential shifts of Vte and Vtp due to the aforementioned factors, the spread of a non-blank Vt distribution may still be wider than a blank Vt distribution of all memory cells. Referring to FIG. 3D, when Vtp of programmed memory cells shifts downwardly due to long retention time, Vte of erased memory cells may also shift downwardly, maintaining a relatively wide spread of the overall Vt of all memory cells, and therefore an operational sense margin.

Referring to FIG. 2, memory sector 200 be used as an example for illustrating the blank check method according to an embodiment of the disclosure. In one embodiment, NVM device 100 may be a flash memory array that is organized as individually erasable sectors each having multiple words. As an example, word 1 to m each consists of 32 bits (32 target cells B1 to B32 and their 32 twin cells cB1 to cB32). In one embodiment, write and read operations of sector 200 may include: 1, Erase entire sector; 2. Program word(s) wherein one of either target or twin cell in one complementary pair is programmed in each of the 32 bits depending on the data being stored; and 3. lead the programmed 32-bit word. As previously explained, reading a word that is still in an erased state (blank) may result in random or spurious data outputs. Similarly, re-programming previously programmed word(s) (non-blank) with new data bits is not allowed without first erasing the sector. Therefore, prior to a program or read operation, it is important to verify the state of the word(s) (i.e. whether it is programmed with real data or whether it is erased or blank) in order to determine whether to proceed with the proposed operation.

Figure 4A:
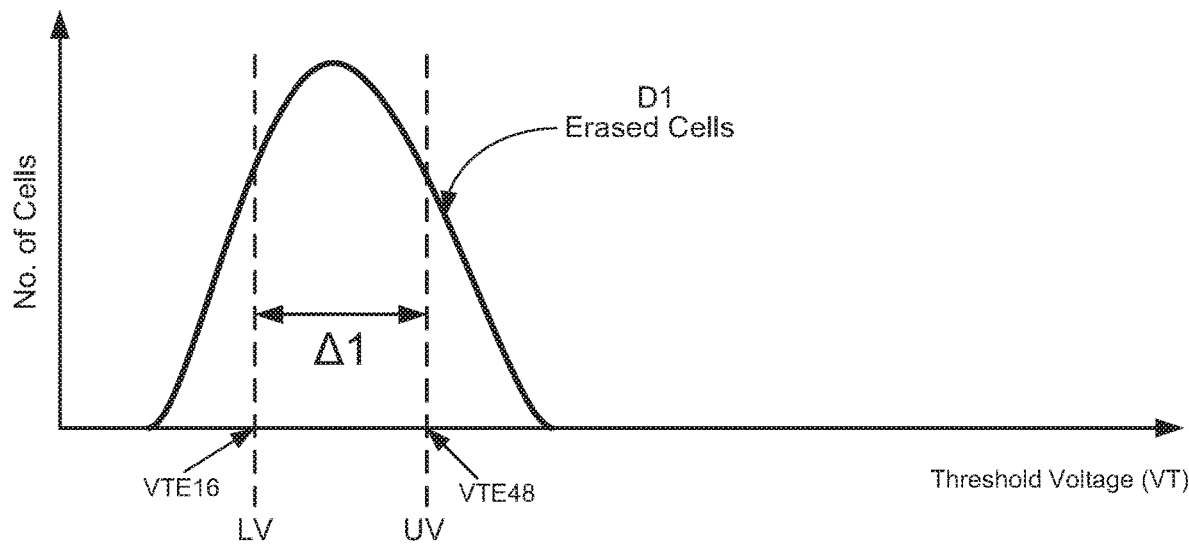
FIGS. 4A-4B are schematic diagrams illustrating distributions of threshold voltages of a portion of the NVM device during a blank state and a non-blank state respectively in accordance with one embodiment of the subject matter.
Figure 4B:
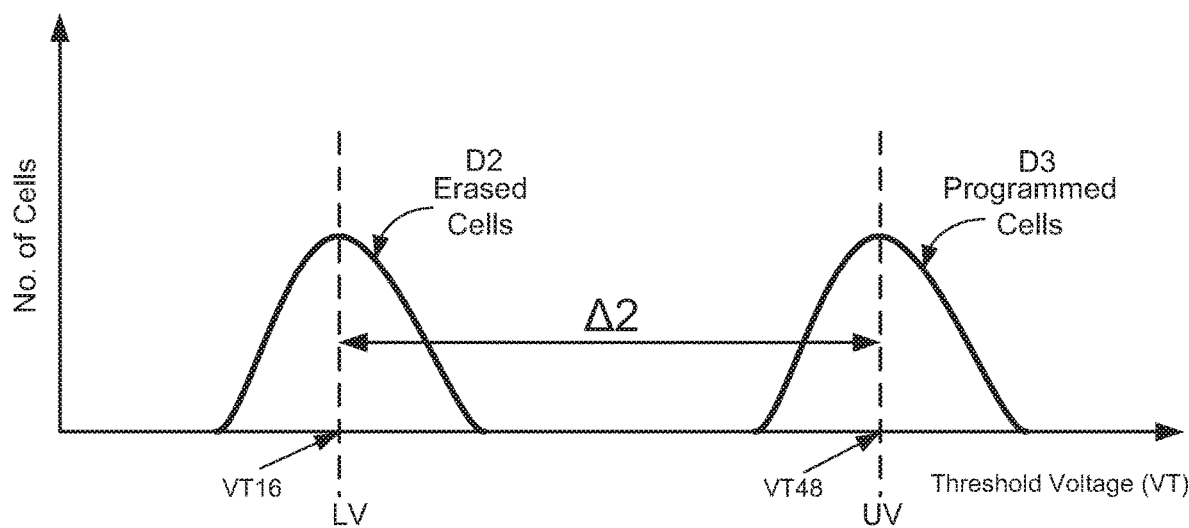

FIGS. 4A and 4B are representative histograms illustrating Vt distribution of a blank word and a non-blank word, respectively. Referring to FIG. 4A, since word 1 of FIG. 2 is erased, Vt of all 64 memory cells may approach each of its Vte, as best shown as a unimodal distribution D1. In one embodiment, distribution D1 may have a certain peak and sigma. The peak and sigma of the erased distribution may vary depending on the number of program/erase cycles and data retention period of memory cells. It will be the understanding that Vt distribution of the entire sector 200 may be similar to D1 if the entire sector 200 is erased.

In one embodiment, Vte1 is the lowest Vte amongst 64 erased memory cells and Vte64 the highest. A lower value (LV) may be defined as the Vt value that a predetermined amount, such as a percentage or a number of memory cells, having equal or lower Vt. An upper value (UV) may be the Vt value that a predetermined percentage or number of memory cells having equal or higher Vt. Referring to FIG. 4A, a lower value or more specifically lower quartile value (LQV) may be calculated wherein 25% of Vt in distribution D1 is equal or less than Q1. In the example of word 1, LQV is Vte16 wherein 25% or 16 memory cells have equal or lower Vte in erased word 1. Similarly, an upper quartile value (UQV) Vte48 may be calculated wherein 25% or 16 memory cells have equal or greater Vte in erased word 1. A range (A), or more specifically an inter-quartile range (IQR) when 25% is adopted, may then be generated by the difference of Vte48 and Vte16 (i.e. Vte48−Vte16=IQR). In one embodiment, IQR may indicate the degree of spread of Vte in distribution D1 and may be used to determine the binary state of word 1. It will be the understanding that 25% is merely one of the percentages that may be adopted to calculate the range of distribution D1. In other embodiments, 5%, 10%, 15%, or other percentages may be adopted without compromising the blank check algorithm disclosed herein. In some embodiments, two different percentages or numbers of memory cells may be adopted to generate the lower value and upper value of distribution D1. It will also be the understanding that word 1 may have any number of bits, and the 32-bit configuration is an exemplary embodiment for explanation purposes, not as limitations.

Referring to FIG. 4B, distribution of Vt of 64 memory cells of programmed (non-blank) word 1 is illustrated. As shown in FIG. 4B, this is a bimodal distribution including distribution D2 for Vt of erased memory cells (Vte) and distribution D3 for Vt of programmed memory cells (Vtp).

In one embodiment, distributions D2 and D3 may each have a certain peak and sigma. The peak and sigma of the distributions may vary depending on the number of program/erase cycles and data retention period of memory cells. In one embodiment, for a 32-bit word, such as word 1, there may be 32 Vte in distribution D2 and 32 Vtp in distribution D3. However, as previously mentioned, Vt of certain cells in D2 and D3 may overlap. Similar FIG. 4A, Vt of all 64 memory cells (32 erased and 32 programmed) may be detected and ranked or compared to one another, and Vt1 and Vt64 being the lowest and highest threshold voltages, respectively. In one embodiment, the lower and upper values may be generated using a predetermined percentage or number of memory cells. When 25% is adopted, as an example, LQV will be Vtp16 and UQV be Vtp48. Then the range $\Delta$ or IQR may be calculated by Vtp48-Vtp16, as illustrated in FIG. 4B. In some embodiments, there may be memory cells having exceptionally high Vte (Which might be included in the lower end of D3) or exceptionally low Vtp (which might be included in the higher end of D2). The situation may not change the accuracy of the algorithm as they are probably still within the range LV to UV of the overall distribution. In other embodiments, the range $\Delta$ or IQR may be generated using other arithmetic methods based on LV and UV that reflect the spread of Vt in the memory cells.

Referring to FIGS. 4A and 4B, there may be a significant difference between the spread of erased (blank) word Vt distribution (D1) and programmed (non-blank) word Vt distribution (D2 and D3), even after factoring the potential effects of high number of endurance cycle and long data retention period, or other factors. In one embodiment, the spread in erased word Vt distribution (range $\Delta 1$ in FIG. 4A) may be smaller than the spread in programmed word Vt distribution (range $\Delta 2$ in FIG. 4B). In one embodiment, a blank check algorithm may be developed to capitalize on this phenomenon.

In one embodiment, a range threshold value (Wv) is predetermined. Wv may be a voltage value generally set between ranges of an erased word $\Delta 1$ and a programmed word $\Delta 2$. When the range of a selected word or sector is below Wv, it may indicate that Vt of the word spreads narrowly enough that its range is below the range threshold value. Therefore, the word is determined or verified to be blank or erased, and it is safe to program real data to its bits. On the contrary, when the range of the selected word is greater than Wv, it may indicate that Vt of the word spreads widely (Vte and Vtp distributions). It may determine or verify the selected word is already programmed with real data, and a read operation may proceed.

Figure 5:
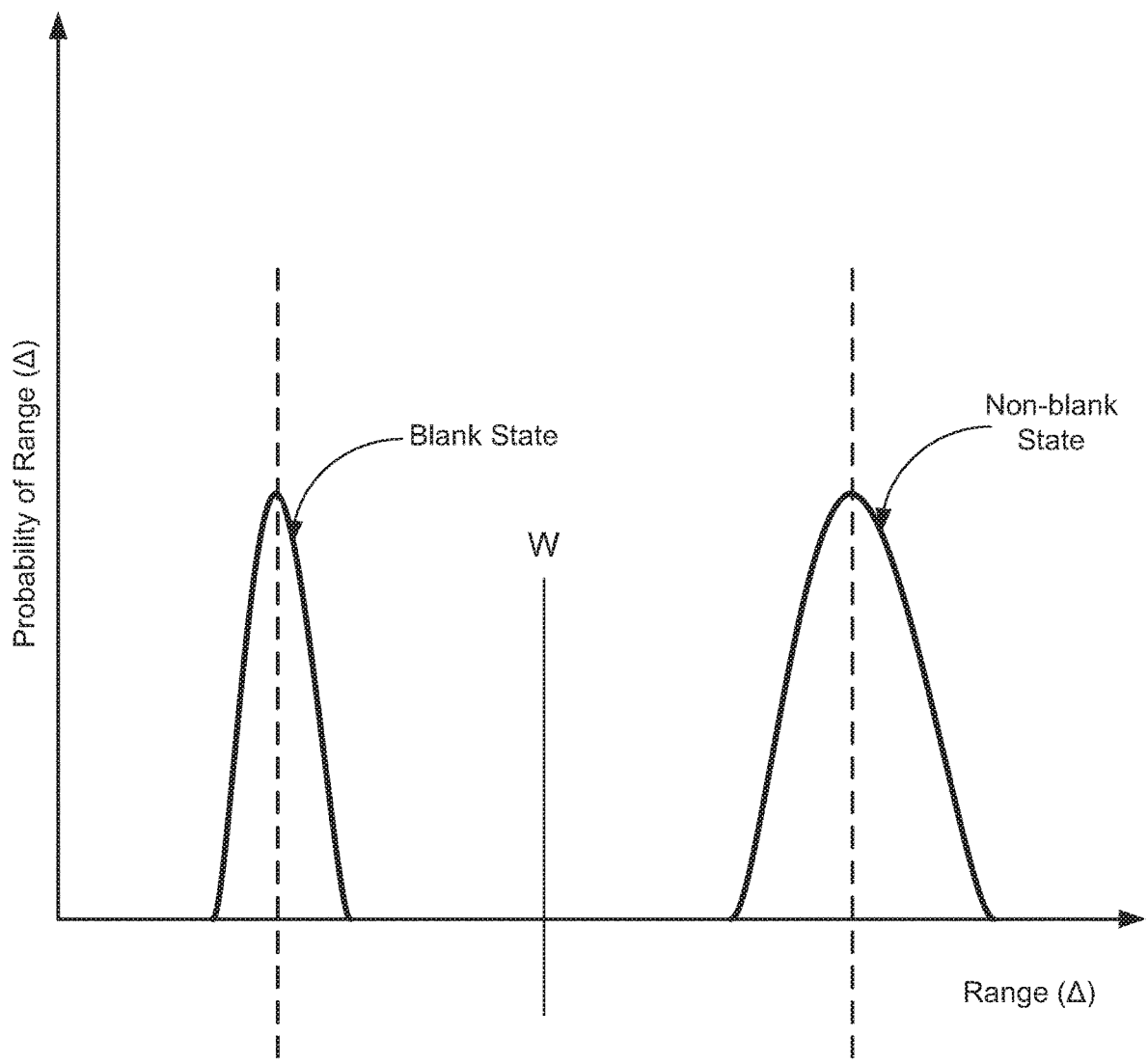
FIG. 5 is a schematic diagram illustrating distributions of threshold voltage ranges of a portion of the NVM device in accordance with one embodiment of the subject matter.

FIG. 5 is a representative histogram showing distribution of range ($\Delta$) of blank words and non-blank words. As best illustrated in FIG. 5, ranges of non-blank words in general are higher than blank words. Therefore, in one embodiment, the threshold value Wv may be determined between the two distribution of ranges. In alternative embodiments, Wv may be a predetermined threshold or a programmable threshold. It may be updated based on at least one of the following parameters: charge loss, length of life, array cycle count, beginning of life and end of life, and more.

Figure 6A:
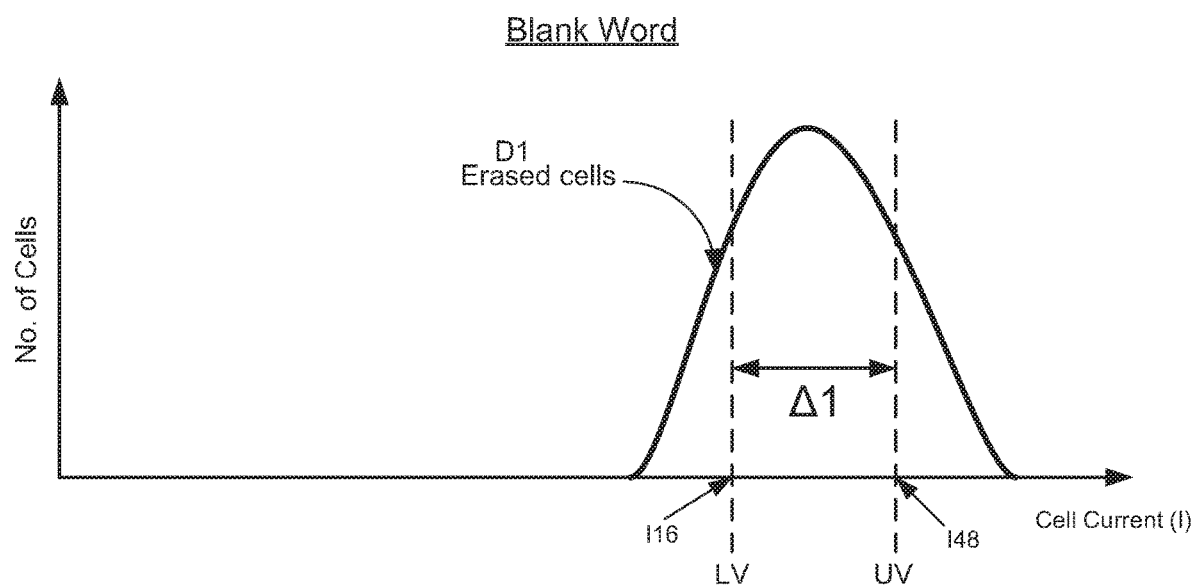
FIGS. 6A-6C are schematic diagrams illustrating distributions of cell currents of a portion of the NVM device during a blank state and a non-blank state in accordance with one embodiment of the subject matter.
Figure 6B:
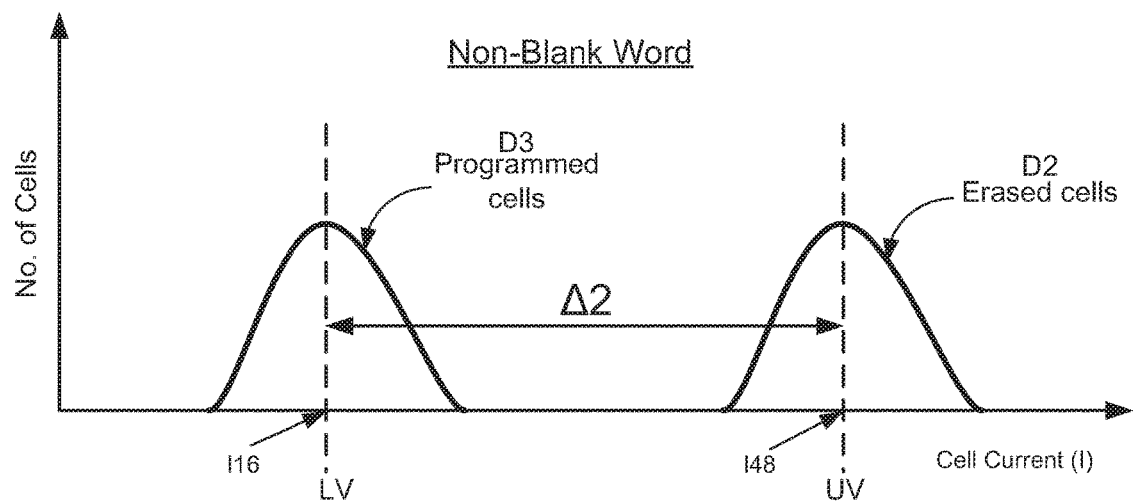

FIGS. 6A and 6B are representative histograms showing distribution(s) of cell currents (I) of memory cells in a blank word and a non-blank word, respectively. In one embodiment, cell (1) may be the current conducted by memory cells when a fixed voltage is applied to their memory gates. One of the advantages of choosing cell current over threshold voltage as the state value for comparison may be more efficient circuit design. In one embodiment, if memory transistors of memory cells are n-channel transistors, I is in general higher in erased cells compared to programmed cells. Referring to FIG. 6A, when the word of 32 bits is blank, I of all memory cells is the erased cell current (Ie). In one embodiment, similar to the Vte distribution in FIG. 3A, the I distribution is unimodal and exhibits a relatively narrow range or spread. Similar to the algorithm disclosed in FIG. 4A, LV may be the $16^{th}$ lowest (25%) Ie in the I distribution and UV may be the $16^{th}$ highest (25%) Ie in the I distribution. The range is therefore generated as $\Delta 1$ (I48-I16). In another embodiment, $\Delta 1$ may be generated using other arithmetic methods other than direct subtraction of UV and LV. It will be the understanding that the number of bits in one word, the percentages or numbers of cells selected. for LV, LV generation in this example are mainly for explanation purposes, and not ended to be limitations. Referring to FIG. 6B, in a non-blank word of 32 bits, half of memory cells (32) may be intended to be erased and half may be intended to be programmed The overall distribution may therefore be bimodal and I of all 64 memory cells may spread wider compared to the distribution in FIG. 6A. In one embodiment, LV (I16 or Ip16) and LV (I48 or Ie48) are then generated according to the similar method disclosed in FIG. 6A. In one embodiment, the range is therefore generated as $\Delta 2$ (I48-I16). In one embodiment, $\Delta 2$ may be greater than $\Delta 1$ because the word contains both erased bits and programmed bits. In one embodiment, a cell current threshold value (Wi) may be a predetermined current based value that lies between $\Delta 1$ and $\Delta 2$. When the range of a word is higher than Wi, it may be considered a non-blank (programmed) word with real data bits. When the range falls below Wi, it may be considered blank (erased). Similar to Wv, Wi may also be predetermined or programmable.

Figure 6C:
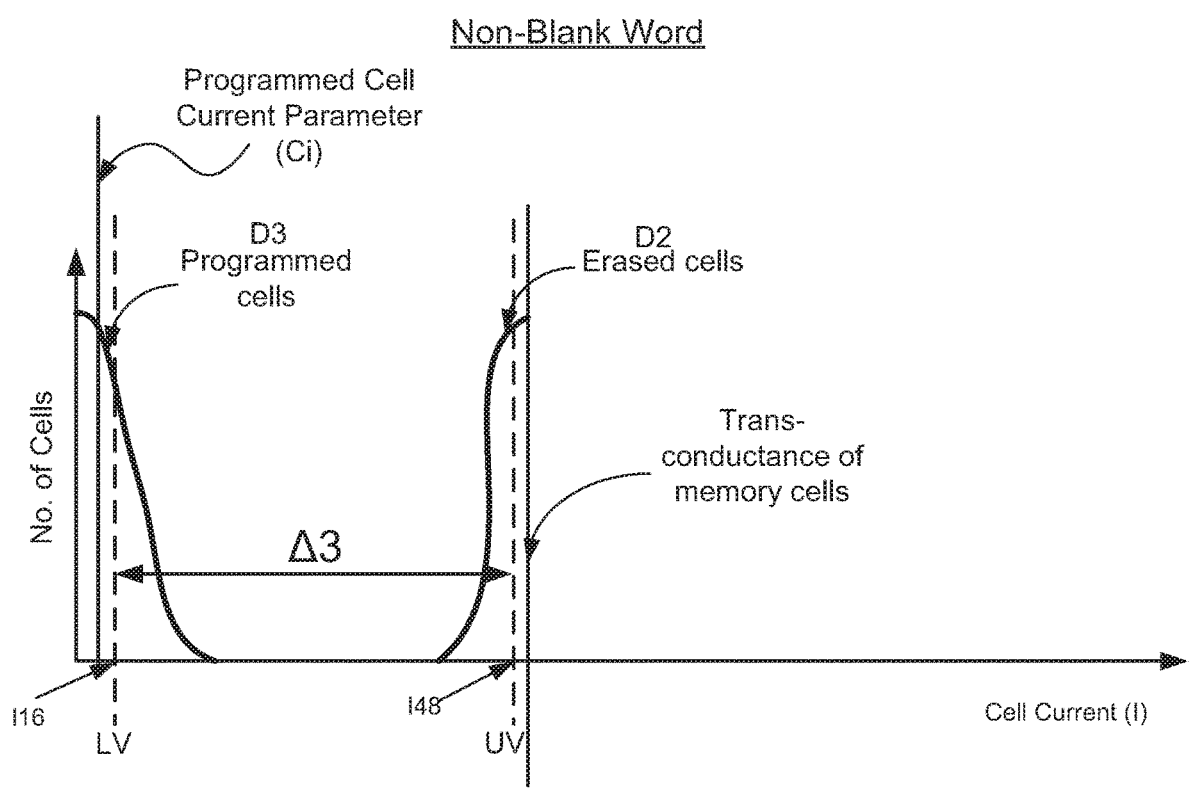

FIG. 6C is a representative histogram illustrating cell current (I) distribution of memory cells in a non-blank word. In one embodiment, no matter what the magnitude of the MG voltage is adopted, or how high the Vtp and Vte difference is, cell currents range from 0 A to trans-conductance current limit, which is a measure of the current carrying capacity of memory cells. In one embodiment, in programmed cells, Ip may approach zero amperes (the lowest current possible) when the memory gate voltage dips below a certain magnitude. The phenomenon may also make LV higher than it is supposed to be and skew the programmed cell distribution of having high frequencies around 0 A, as best shown in FIG. 6C. Also, the low MG voltage may also create a downward shift of Ie of erased cells which may further reduce the range of overall cell current distribution. In another embodiment, Ie of erased cells may not exceed the trans-conductance level of the memory transistors no matter how high the memory gate voltage is. In one embodiment, it may make UV lower than it is supposed to be and skew the erased cells distribution (Ie) of having high frequencies around trans-conductance of memory transistors, as best shown in FIG. 6C. The high MG voltage may also create an upward shift of Ip of programmed cells, which further reduce the overall cell current range. The 0 A and transconductance situations of cell currents of memory cells, individually or in combination, may cause the range of I ($\Delta 3$) of memory cells of non-blank word less than it is supposed to be. As a result, $\Delta 3$ may fall under the predetermined Wi and the non-blank word W1 may be falsely verified as a blank word.

To rectify the above situation, in one embodiment, a programmed cell current parameter (Ci) may be determined within a relatively low range of programmed I (Ip) of memory cells. As an additional step to augment the I range algorithm, LV may be compared to Ci. If LV is found below Ci, it may indicate than enough % or number of memory cells have cell currents that fall within a relatively low range of Ip. In one embodiment, the word may be concluded as non-blank. If LV is found above Ci, the comparison result is inconclusive and the I range algorithm may continue to compare the I range to Wi, as previously disclosed.

Figure 7:
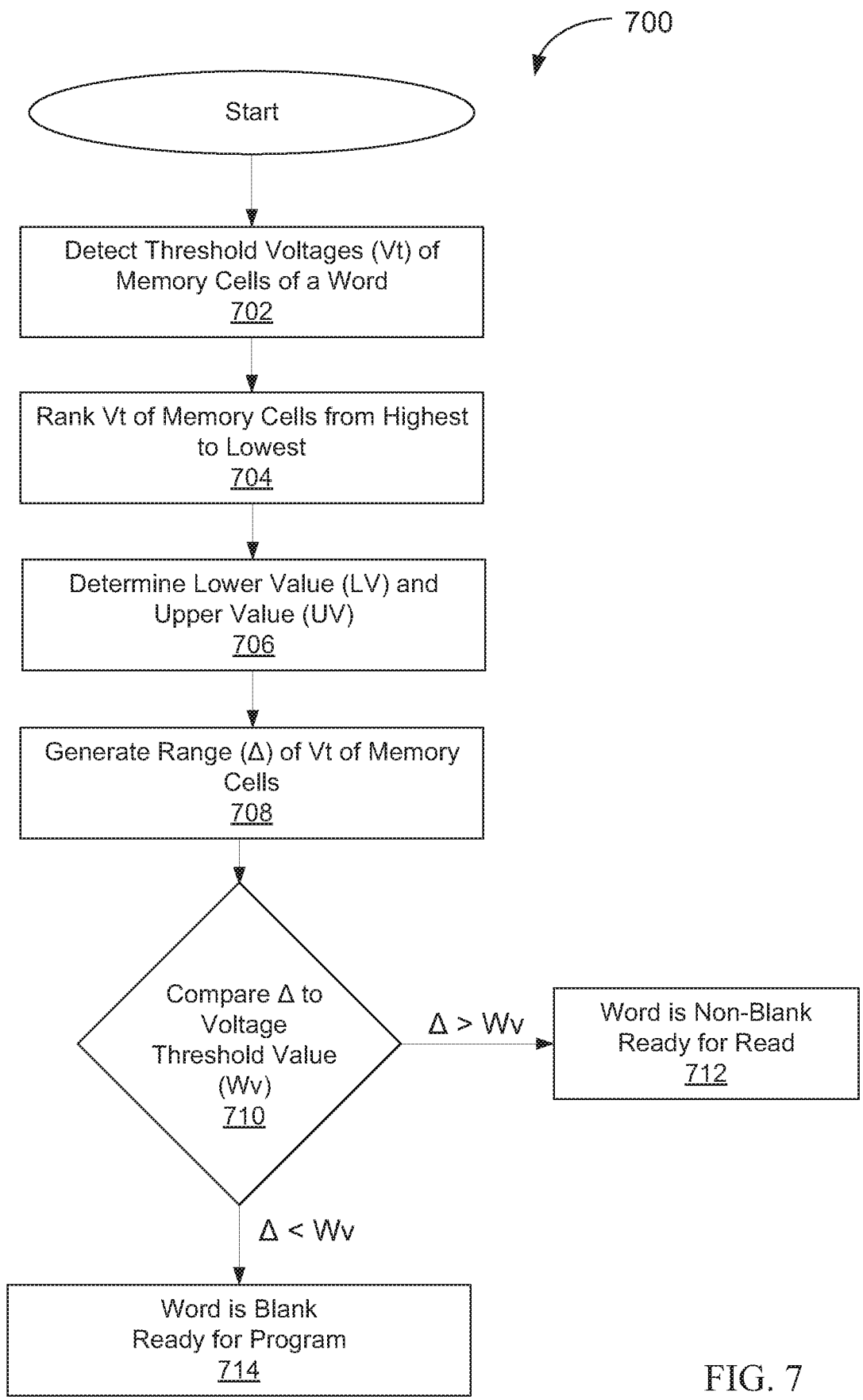
FIG. 7 is a representative flowchart illustrating the threshold voltage based memory blank check algorithm in accordance with one embodiment of the subject matter.

FIG. 7 is a representative flowchart illustration of one embodiment of method 700 steps of performing a blank check on a selected word or sector of a memory device. In one embodiment, the system may select a particular word or sector of a memory to perform a blank check before proceeding to operations, such as write, read, etc. In step 702, the threshold voltage (Vt) of each memory cell in the selected word is detected or determined. In one embodiment, the system may detect the memory gate voltage required for each memory cell when a predetermined reference current is to be conducted. In other embodiments, Vt may be determined by other methods that are known and practiced in the art. In step 704, Vt of all memory cells are ranked from the lowest to the highest. In step 706, a lower value (LV) and an upper value (UV) of Vt are determined. In one embodiment, a particular percentage (X %) or number (Y) of Vt is predetermined such that X % of or Y Vt of all the memory cells may be less than LV. Similarly, in one embodiment, X % of or Y Vt of all the memory cells may he greater than UV. In an alternative embodiment, the predetermined percentage or number of Vt for generating the LV and UV may be different. In other embodiments, LV may be generated by performing a binary search from a low starting Vt and finding memory cells below that Vt, and iterating in a binary search fashion until X % or Y number of cells are found to be below the checked Vt, which then becomes the LV. Similarly, UV is found by starting the search at a high starting Vt and a binary search is performed until, at a certain checked Vt, there are X % or Y number of cells above that Vt. In one alternative embodiment, the exact magnitude of Vt of each memory cell may not be determined individually, LV and UV may be determined by simply comparing Vt of different memory cells until the LV and UV are generated.

Subsequently, in step 708, the Vt range is generated by calculating the difference between UV and LV, i.e. $\Delta$=UV−LV. In step 710, $\Delta$ is compared to a voltage threshold value (Wv). As mentioned earlier, Wv may be a predetermined voltage value that lies between a non-blank word Vtp and Vte distribution range and a blank word Vte distribution range. In an alternative embodiment, Wv may be programmable and be updated based on various aforementioned factors. Based on the outcome of the comparison, if $\Delta$ is greater than Wv, the selected word is considered as having a relatively wide spread of Vt, and may be determined or verified as non-blank (programmed). Since real data bits are considered stored in the memory cells, the selected word may he ready for a read operation. In one embodiment, the read operation may be differential sensing based. If $\Delta$ is less than Wv, the selected word is determined to he blank (erased). In one embodiment, a program operation may proceed wherein real data bits are written to the blank selected word. In one alternative embodiment, the binary state of selected word may not be determined by a direct comparison of the magnitude of $\Delta$ and Wv, other comparison algorithms may he adopted.

Figure 8:
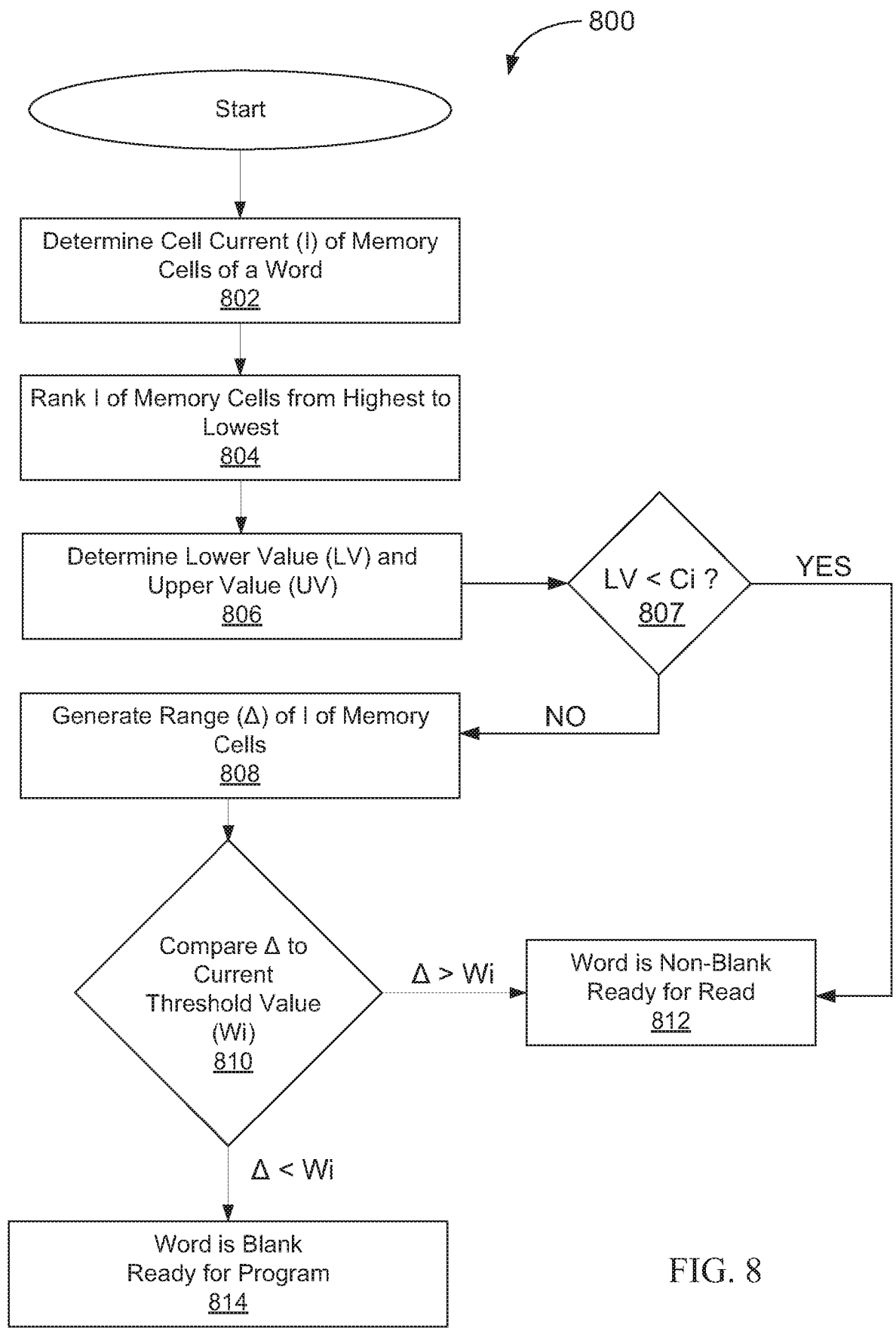
FIG. 8 is a representative flowchart illustrating the cell current based memory blank check algorithm in accordance with one embodiment of the subject matter.

FIG. 8 is a representative flowchart illustration of another embodiment of method 800 steps of performing a blank check on a selected word or sector of a memory device. Method 800 is similar to the method 700 described in FIG. 7, except the method is based on cell currents of the selected word/sector. In one embodiment, the system may detect the current conducted by each memory cells (I) when a predetermined gate voltage is applied to memory gates of memory transistors. In other embodiments, I may be determined by other methods that are known and practiced in the art. In step 804, I of all memory cells are ranked from lowest to highest. In step 806, a lower value (LV) and upper value (UV) of I are generated. In one embodiment, a particular percentage (X %) or number (Y) of Vt is predetermined such that X % of or Y number of I of all the memory cells may be less than LV. Similarly, in one embodiment, X % of or Y number of I of all the memory cells may be greater than UV. In an alternative embodiment, the predetermined percentage or number of I for generating the LV and UV may be different. In other embodiments, LV may he generated by performing a binary search from a low starting cell current and finding memory cells below that I, and iterating in a binary search fashion until X % or Y number of cells are found to be below the checked I, which then becomes the LV. Similarly, UV is found by starting the search at a high starting I and a binary search is performed until, at a certain checked I, there are X % or Y number of cells above that I. In one embodiment, the exact magnitude of cell current of each memory cell may not need to he determined, LV and UV may be generated by comparing I of different memory cells.

Subsequently in step 807, LV is compared to a predetermined programmed cell current parameter (Ci). In one embodiment, Ci may be selected within a low range of programmed cell current (Ip). If LV is less than Ci, enough number of cells may have low I, which may indicate that the selected word is non-blank (programmed). If LV is greater than Ci, the result is inconclusive and the method 800 may proceed to step 808. In step 808, the I range is generated by calculating the difference between UV and LV, i.e. $\Delta$=UV−LV, In step 710, $\Delta$ is compared to a cell current threshold value (Wi). As mentioned earlier, Wi may be a predetermined current value lies between a non-blank word Ip and Ie distribution range and a blank word Ie distribution range. In an alternative embodiment, Wi may be programmable. Based on the outcome of the comparison, if $\Delta$ is greater than Wi, the selected word is considered having a relatively wide spread of I, and may be determined as non-blank (programmed). Since real data bits are considered stored in the memory cells, the selected words ready for a read operation. In one embodiment, the read operation may be differential sensing based. If $\Delta$ is less than Wi, the selected word is determined to be blank (erased). In one embodiment, a program operation may proceed Wherein real data bits are written to the blank selected word. In one alternative embodiment, the binary state of selected word may not be determined by a direct comparison of the magnitude of $\Delta$ and Wi, other comparison algorithms may be adopted.

Figure 9:
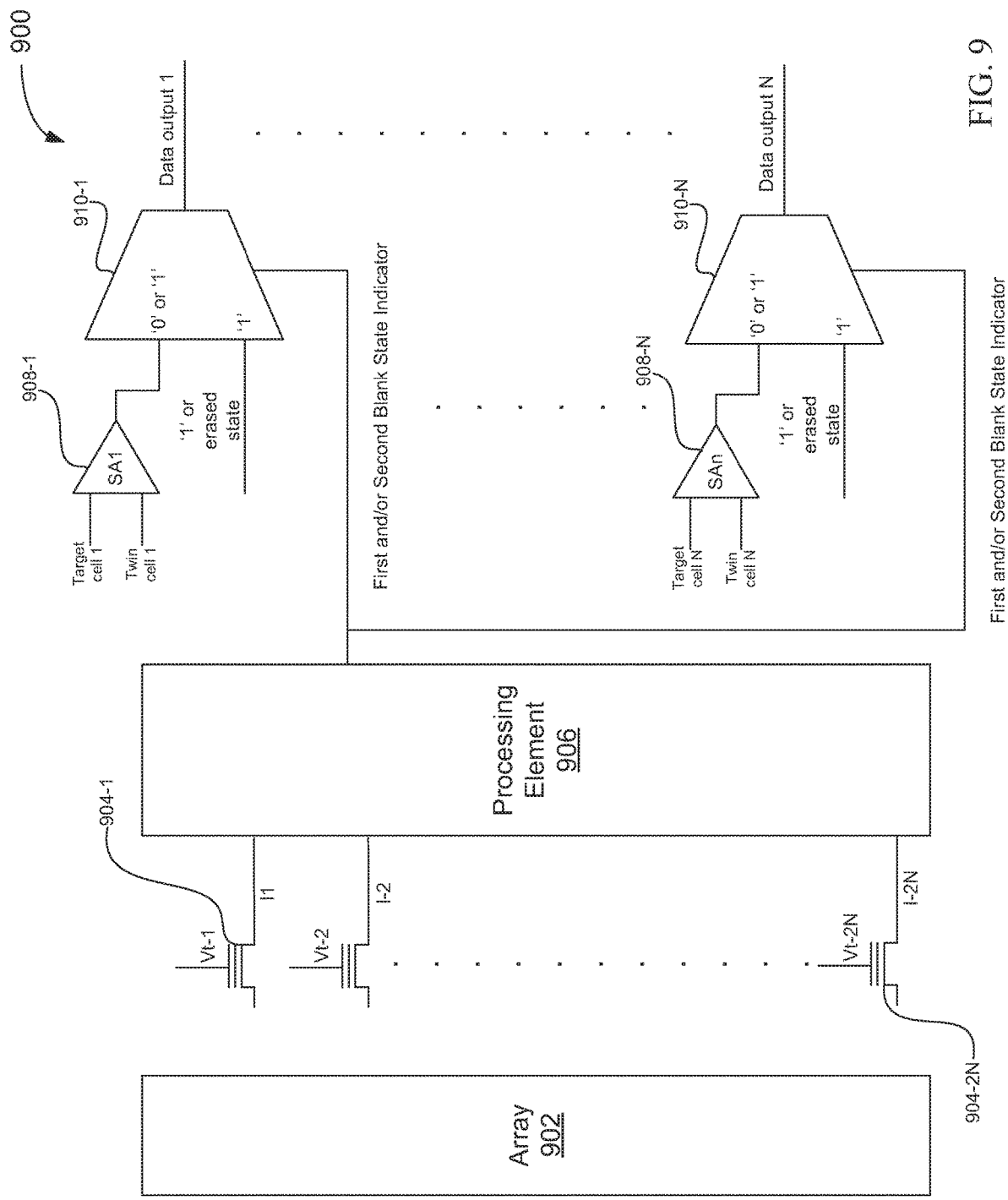
FIG. 9 is a representative schematic diagram illustrating a memory system in accordance with one embodiment of the subject matter.

FIG. 9 is a representative schematic block diagram of a memory device or system according to one embodiment oft he present disclosure. The memory device 900 includes a memory array 902 that may be a flash memory array, EEPROM, etc., having a split gate configuration, 2T or 1T configurations. Memory array 902 may include a plurality of NVM cells and peripheral circuitry as described in this application and known in the art. In one embodiment, memory array 902 may be organized in sec s and each sector may include multiple words. Each word may include one or more complementary cell each having a target cell (true bit) and a twin cell (complementary bit), configured for differential programming and sensing. In one embodiment, when a N-bit word (N target cells and N twin cells) is selected for a read operation, threshold voltages Vt-1 to Vt-2n and/or cell currents I-1 to I-2 n of each target and twin cells 904-1 to 904-2N may be detected and the results coupled to processing element 906. In one embodiment, the detection of Vt or I may be performed by processing element 906. In various embodiments, processing element 906 may be a microprocessor, a state machine, a system-on-chip, a controller, or a combination thereof. In one embodiment, processing element 906 may then generate a lower value (LV) and an upper value (UV) of Vt and/or I according to the aforementioned method(s) disclosed in FIGS. 7 and 8, and their corresponding description. Subsequently, processing element 906 may generate a Vt range or I range of the selected N-bit word. In one embodiment, processing element 906 may then generate a first blank state indicator to signify the binary state of the selected N-bit word based on the comparison between the Vt range and/or I range to the threshold range value. As previously mentioned, the threshold range value may be a voltage value or a current value depending on the selected algorithm, and it may be predetermined or programmable. The first blank state indicator may verify whether the selected N-bit word is blank (erased state) or non-blank (programmed state). In one embodiment, in the event that the cell current algorithm is adopted, processing element 906 may generate a second blank state indicator based on the comparison between the LV of cell currents and a cell current parameter, as best shown in FIG. 8. The second blank state indicator may verify if the selected N-bit word is in a non-blank state.

Referring to FIG. 9, memory device 900 may have multiple multiplexors 910-1 to 910-N, and each multiplexor may have at least two inputs. In one embodiment, a differential sensing result of one complementary cell is an input to one multiplexor, such as the result of SA1 is coupled to one input of multiplexor 910-1. An erased binary state value '1' is coupled to another input of multiplexor 910-1 to 910-N. As best shown in FIG. 9, the first and second blank state indicators from processing element 906 are coupled to each of multiplexors 910-1 to 910-N as control signals. When the first blank state indicator verifies that the selected N-bit word is blank, multiplexors 910-1 to 910-N may ignore the differential sensing inputs from SA1 to SNn and output the erased binary state value as their outputs, signifying every cells in the selected N-bit word is in an erased state ("1"). When the first blank state indicator verifies that the selected N-bit word is non-blank, multiplexors 910-1 to 910-N may output the differential sensing results ("0" or "1" depending on the written data bits) of SA1 to SAn as their outputs. In one embodiment when cell current algorithm is adopted, multiplexors 910-1 to 910-N may output the differential sensing results of SA1 to SAn as their outputs when the second blank state indicator from processing element 906 verifies the selected N-bit word is non-blank. However, When the second blank state indicator is inconclusive, multiplexors 910-1 to 910-N may rely on the first blank state indicator to select their data outputs 1 to N. It will be the understanding that blank check algorithms disclosed herein may be executed in memory device or system of different configurations and structures. The embodiment disclosed in FIG. 9 is for illustrative purposes only, and not as limitations.

Embodiments of the subject matter include various operations described herein. These operations may be performed by hardware components, software;, firmware, or a combination thereof.

Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the subject matter as set forth in the appended claims. The specification and drawings are, accordingly, to be regarded in an illustrative sense rather than a restrictive sense.

What is claimed is:

1. A method for operating a memory device, wherein the memory device includes a plurality of complementary memory cells, each including a true transistor and a complementary transistor, comprising:
    detecting a state value of said each of the true and complementary transistors;
    generating an upper state value, wherein a first predetermined amount of the true and complementary transistors have greater state values than the upper state value;
    generating a lower state value, wherein a second predetermined amount of the true and complementary transistors have less state values than the lower state value;
    generating a state value range based on a difference between the upper state value and the lower state value; and
    comparing the state value range to a threshold value to determine whether the plurality of complementary memory cells is in a blank state or a non-blank state.

2. The method of claim 1, wherein the state values of the true and complements transistors of a same complementary memory cell are used to determine a binary state of the same complementary memory cell, and wherein the binary state represents a programmed state or an erased state.

3. The method of claim 1, wherein the state value is a threshold voltage of the true and complementary transistors of the plurality of complementary memory cells, and the threshold value is a voltage value.

4. The method of claim 1, wherein the state value is a cell current of the true and complementary transistors of the plurality of complementary memory cells, and the threshold value is a current value.

5. The method of claim 4, wherein the cell current is generated by applying a predetermined voltage to gates of the true and complementary transistors.

6. The method of claim 1, further comprising:
ranking the state values of at least two of the true and complementary transistors of the plurality of complementary memory cells.

7. The method of claim 1, wherein at least one of the first predetermined amount and the second predetermined amount represents a percentage.

8. The method of claim 1, wherein at least one of the first predetermined amount and the second predetermined amount represents a natural number.

9. The method of claim 1, wherein the threshold value is programmable and updated based on at least one of the following parameters: charge loss, length of life, array cycle count, and a state of beginning of life or end of life of the plurality of complementary memory cells.

10. The method of claim 1, wherein generating the upper state value and the lower state value includes performing binary searches on the state values of the true and complementary transistors.

11. The method of claim 1, wherein when the state value range is greater than the threshold value, the plurality of complementary memory cells is determined to be in the non-blank state, and wherein when the state value range is less than the threshold value, the plurality of complementary memory cells is determined to be in the blank state.

12. The method of claim 4, further comprising:
comparing the lower state value to a cell current parameter, wherein when the tower state value is less than the cell current parameter, the plurality of complementary memory cells is determined to be in the non-blank state.

13. The method of claim 1, wherein:
the blank state indicates all of the true and complementary transistors of the plurality of complementary memory cells are in an erased state; and
the non-blank state indicates one half of the true and complementary transistors of the plurality of complementary memory cells are in the erased state, and wherein another half of the true and complementary transistors of the plurality of complementary memory cells are in the programmed state.

14. A memory device, comprising:
a plurality of complementary memory cells, each including a true transistor and a complementary transistor;
a processing element coupled to the plurality of complementary memory cells, configured to;
detect a cell current of each of the true and complementary transistors by applying a predetermined gate voltage thereon;
generate an upper cell current value, wherein a first predetermined amount of the true and complementary transistors have greater cell currents than the upper cell current value;
generate a lower cell current value, wherein a second predetermined amount of the true and complementary transistors have less cell currents than the lower cell current value;
generate a cell current range based on the upper and lower cell current values;
generate a first binary state indicator based on a comparison of the cell current range and a threshold value; and
a plurality of sensing devices configured to determine a binary state of each of the plurality of complementary memory cells.

15. The memory device of claim 14, wherein the plurality of sensing devices includes sense amplifiers configured to generate a differential sensing result of the true and complementary transistors of a same complementary memory cell, further comprising:
a plurality of multiplexors, wherein each multiplexor is configured to be coupled to the differential sensing result of one of the plurality of complementary memory cells and an erased binary state signal, the each multiplexor is further configured to be coupled to the first a state indicator as a first control signal.

16. The memory device of claim 15, wherein the processing device is further configured to generate a second binary state indicator based on a comparison of the lower cell current value to a cell current parameter, and wherein the second binary state indicator is coupled to the each multiplexor as a second control signal.

17. The memory device of claim 15, wherein a binary state of the plurality of complementary memory cells represents a blank state or a non-blank state.

18. A non-transitory computer readable storage medium comprising stored instructions thereon, the instructions When executed cause a processing element to:
execute a blank check of N x complementary memory cells, each complementary memory cell includes a true cell and a complementary cell, the blank check further includes;
detecting a state value of each of the true and complementary cells;
generating an upper state value, wherein a first predetermined amount of the true and complementary cells have greater state values than the upper state value;
generating a lower state value, wherein a second predetermined amount of the true and complementary cells have less state values than the upper state value;
generating a state value range based on the upper state value and the lower state value; and
generating a first blank state indicator based on a comparison between the state value range to a threshold value, wherein the first blank state indicator verifies the N x complementary memory cells is in a blank state when the state value range is less than the threshold value, and the N x complementary cells is in a non-blank state when the state value range is greater than the threshold value.

19. The non-transitory computer readable storage medium of claim 18, wherein the state value is a cell current, and wherein the blank check further includes:
generating a second blank state indicator based on a comparison between the lower state value and a cell current parameter, wherein the second blank state indicator verifies the N x complementary memory cells is in the non-blank state when the lower state value is less than the cell current parameter.

20. The non-transitory computer readable storage medium of claim 18, wherein the processing element is configured to:
execute a read command of the N x complementary memory cells based on the first blank state indicator when the N x complementary memory cells are determined to be in the non-blank state.

21. The non-transitory computer readable storage medium of claim 19, wherein the processing element is configured to: proceed to execute a read command of the N x complementary memory cells based on at least one of the first and second blank state indicators.

\* \* \* \* \*